United States Patent [19]

Nikami

[11] 3,887,823

[45] June 3, 1975

[54] DIFFERENTIAL AMPLIFIER PULSE DELAY CIRCUIT

[75] Inventor: Akira Nikami, Yokohama, Japan

[73] Assignee: Sony Corporation, Tokyo, Japan

[22] Filed: Dec. 18, 1973

[21] Appl. No.: 425,839

[30] Foreign Application Priority Data

| | | |
|---|---|---|
| Jan. 19, 1973 | Japan | 48-8444 |
| Dec. 21, 1972 | Japan | 47-14689 |
| May 4, 1973 | Japan | 48-50018 |

[52] U.S. Cl. .............. 307/293; 307/235 R; 307/237; 307/273; 307/290; 330/30 D

[51] Int. Cl. .............. H03k 17/26

[58] Field of Search ........ 307/290, 293, 273, 235 R, 307/237; 328/146; 330/30 D

[56] References Cited

UNITED STATES PATENTS

| | | | |
|---|---|---|---|
| 3,364,441 | 1/1968 | Rogers | 307/293 |
| 3,365,586 | 1/1968 | Billings | 307/293 |
| 3,471,717 | 10/1969 | Ryan | 307/290 |
| 3,504,202 | 3/1970 | Rittmann et al. | 307/290 |
| 3,514,641 | 5/1970 | Gunderson et al. | 307/293 |
| 3,571,626 | 3/1971 | Reif | 307/290 |
| 3,654,494 | 4/1972 | Bartlett et al. | 307/293 |
| 3,725,673 | 4/1973 | Frederiksen et al. | 307/235 R |
| 3,735,150 | 5/1973 | Harris | 307/235 R |
| 3,742,257 | 6/1973 | Wittenzellner | 307/293 |
| 3,818,356 | 6/1974 | Kinbara | 307/235 R |

OTHER PUBLICATIONS

IBM Tech. Disclosure Bulletin by Fredriksen, Vol. 9, No. 5, Oct. 1966, p. 527.

*Primary Examiner*—Stanley D. Miller, Jr.
*Attorney, Agent, or Firm*—Lewis H. Eslinger; Alvin Sinderbrand

[57] ABSTRACT

A pulse delay circuit including a differential amplifier with two transistors, a clamping transistor, and a resistor capacitor time constant circuit connected to the base input terminal of one of the differential amplifier transistors. A reference voltage is connected to the base input terminal of the other differential transistor. Pulses to have at least one edge delayed are applied to the clamping transistor to clamp the capacitor to a predetermined charge level and the first differential transistor to cut-off. At the end of the pulse, voltage across the capacitor starts to change, and after a predetermined delay time, the voltage at the input terminal of the first differential transistor reaches the reference voltage level, causing the first differential transistor to become conductive and causing the second to become non-conductive by differential operation.

11 Claims, 22 Drawing Figures

DIFFERENTIAL AMPLIFIER PULSE DELAY CIRCUIT

BACKGROUND OF THE INVENTION

1. Field of the Invention

This invention relates to a delay circuit and particularly is directed to an improved pulse signal delay circuit suitable for use in an integrated circuit (IC) design in place of a conventional monostable multivibrator.

2. Description of the Prior Art

For a long time monostable multivibrator circuits have been used as pulse signal delay circuits, for example in servo control circuits. According to the present state of development of IC designs, some of the circuit configurations of monostable multivibrators cannot readily be used. For example, a condenser in a time constant circuit has to be interposed between the collector electrode of one transistor and the base electrode of the other transistor. This requires extra terminals to be added to the IC package because the difficulty of making a capacitor in the circuit using integration methods makes it desirable or even mandatory to use a separate capacitor. As is well known, the number of external terminals of an IC should be held to a minimum, and in fact this is more important than the simplicity of the circuit configuration, itself.

In addition, conventional monostable multivibrators sometimes require a differential circuit having another capacitor at their input circuits.

Accordingly, a primary object of this invention is to provide an improved delay circuit for a pulse signal.

A further object is to provide an improved pulse signal delay circuit suitable for integrated circuit design.

Further objects and advantages are described in more detail in the explanations of each embodiment of this invention.

SUMMARY OF THE INVENTION

The circuit referred to by the term "delay circuit" used in this specification does not delay the input pulse exactly but does delay the timing of either the leading edge or trailing edge of the input pulse signal.

In order to overcome the defects of the prior art and to gain some advantages, the delay circuit according to the present invention includes a time constant circuit, an input transistor, a differential amplifier and a reference bias voltage circuit. The base electrode of one of the two transistors in the differential amplifier is connected to the reference bias voltage circuit and the base electrode of the other differential transistor is connected to both the input transistor and the time constant circuit, whereby at least one terminal of the capacitor in the time constant circuit is connected to a necessary common terminal, such as either ground or power supply terminal. Thus, no more than one additional terminal need be provided for the capacitor.

DETAILED EXPLANATION OF THE PRESENT INVENTION

Figure 1:
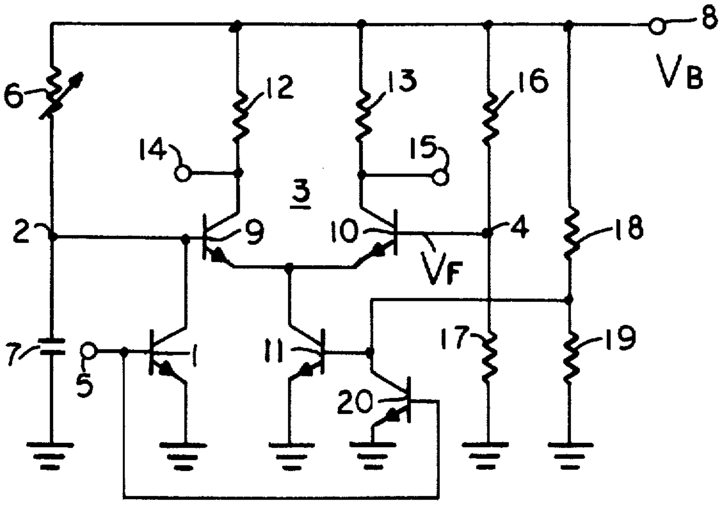
FIG. 1 is a schematic circuit diagram of one embodiment of the present invention.

In FIG. 1, an input transistor 1 has its collector connected to a first input terminal 2 of a differential amplifier 3. A second input terminal 4 of the differential amplifier receives, during operation, a reference bias voltage. An input terminal 5 connected to the base electrode of the input transistor 1 is the pulse input terminal by way of which pulses to be delayed are applied to the circuit.

A time constant circuit consisting of a variable resistor 6 and a capacitor in series is connected between ground and a power supply terminal 8 to which a direct voltage $V_B$ is supplied. The ground terminal and the power supply terminal 8 would be necessary for any delay circuit, even if the circuit is constructed in IC form. Thus, the resistor 6 and capacitor 7 can be external to an IC device that includes all of the other components in FIG. 1 and yet only one additional terminal, terminal 2, is required to connect the resistance-capacitance circuit to such an IC.

The differential amplifier 3 includes two differential, or differentially connected, transistors 9 and 10. The base of the transistor 9 is connected to the terminal 2, along with both the collector electrode of the transistor 1 and the common circuit point of the resistance-capacitance time constant circuit. The emitter electrodes of the two transistors 9 and 10 are connected together and are grounded through the emitter-collector circuit of a transistor 11, which serves as a constant current source. This transistor can be replaced by a resistor having a relatively high value of resistance. The collector electrodes of the differential transistors are connected to the power supply terminal 8 through load resistors 12 and 13 respectively, and the collector electrodes are also connected to two output terminals 14 and 15, although one of these output terminals is not always necessary.

The reference bias voltage circuit is a voltage divider consisting of a series circuit of two resistors 16 and 17, and the reference bias voltage $V_F$ is obtained at the common circuit point between these resistors and is applied to the base electrode of the transistor 10. Another series circuit of two resistors 18 and 19 is also connected between the power supply terminal 8 and ground. The common circuit point of this series circuit is connected to the base electrode of the transistor 11 to supply a proper bias voltage which makes that transistor operate as a constant current source. The emitter-collector output circuit of a transistor 20 is connected between the base of the transistor 11 and ground. The input terminal 5 is connected to the base electrode of the transistor 20 and makes the transistor 11 non-conductive during the time when positive pulses are applied to the input terminal 5.

Figures 2A, 2B, 2C, 2D:
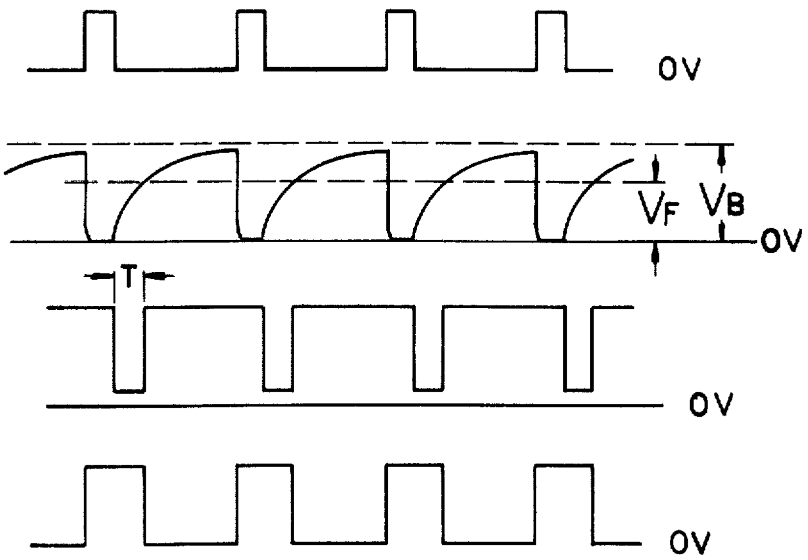
FIGS. 2A–2D are time charts of the waveforms to be used to explain the operation of the embodiment shown in FIG. 1.

Operation of the circuit in FIG. 1 will be explained with reference to the waveforms in FIGS. 2A–2D. FIG. 2A shows a pulse wave of positive pulses of the type to be applied to the input terminal 5. These positive pulses cause the transistors 1 and 20 to become conductive for the duration of each pulse, so that the base of the transistor 11 is short-circuited to ground, making that transistor to become non-conductive and causing the charge stored in the capacitor 7 to be discharged through the input transistor 1. The transistor thus clamps the terminal 2 and the base of the transistor 9 to ground. As mentioned above, the transistor 11 is kept non-conductive for the duration of each positive pulse applied to the input terminal 5. This causes both of the transistors 9 and 10 also to remain non-conductive and both of the output terminals 14 and 15 to be at the power supply voltage $V_B$.

After each positive pulse ends, both of the transistors 1 and 20 become non-conductive and the transistors 10 and 11 become conductive. The voltage at the collector of the transistor 10 drops to a low voltage, as shown in FIG. 2C. This marks the beginning of the delay interval T. Once the transistor 1 becomes non-conductive, it no longer clamps the voltage across the capacitor 7 to zero, and the capacitor can start to charge up through the variable resistor 6 toward the power supply voltage $V_B$. The rate of charge is determined by the capacitance of the capacitor 7 and by the resistance of the variable resistor 6. During this time the transistor 11 operates as a constant current source, as mentioned before. The transistor 9 is still kept non-conductive until the voltage at terminal 2 attains the level of the voltage $V_F$ which is applied to the base electrode of the transistor 10. The voltage $V_F$ is determined by the equation:

$$V_F = V_B\ R_{17}/R_{16} + R_{17}$$

where:

$R_{16}$ is the resistance of the resistor 16, and $R_{17}$ is the resistance of the resistor 17.

When the voltage at the terminal 2 reaches $V_F$, the transistor 9 becomes conductive and the voltages at its collector suddenly drops, as shown in FIG. 2D. By differential action, the transistor 10 simultaneously becomes non-conductive, and the voltage at its collector rises suddenly, marking the end of the delay interval T as shown in FIG. 2C. The transistor 9 continues to be non-conductive until the next positive pulse shown in FIG. 2A is applied to the terminal 5.

Figure 3:
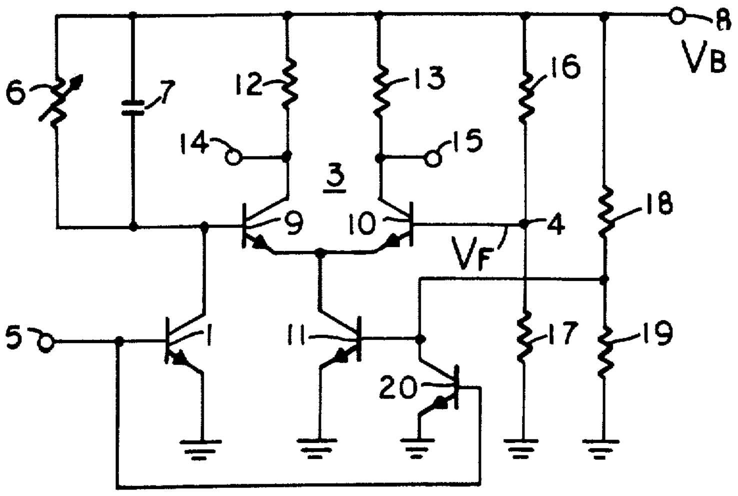
FIGS. 3–5 are schematic diagrams of modified embodiments based on the circuit in FIG. 1.

A modification of the delay circuit in FIG. 1 is shown in FIG. 3. The difference between the two circuits is only the time constant circuit composed of the capacitor 7 and the variable resistor 6. In FIG. 3, the capacitor 7 is connected in parallel with the variable resistor 6. This circuit still requires on the single extra terminal 2 to connect to the base of the transistor. The other terminal of the capacitor is simply connected to the already-available terminal 8 instead of the already-available ground terminal.

In the operation of the circuit in FIG. 3, the capacitor 7 is charged to power supply voltage $V_B$ during the time when the positive pulse shown in FIG. 2A is applied to the input terminal 5 to clamp the terminal to to approximate ground potential. After termination of the positive pulse, the charge begins to discharge through the variable resistor 6. This causes the voltage value applied to the base electrode of the transistor 9 to rise from zero as shown in FIG. 2B. The transistor 9, having had its base clamped to approximately ground potential during the pulse applied to the terminal 5, remains non-conductive and the transistor 10 becomes conductive at the same times and in the same manner as in FIG. 1, and thus, the time delay T is the same.

Figure 4:
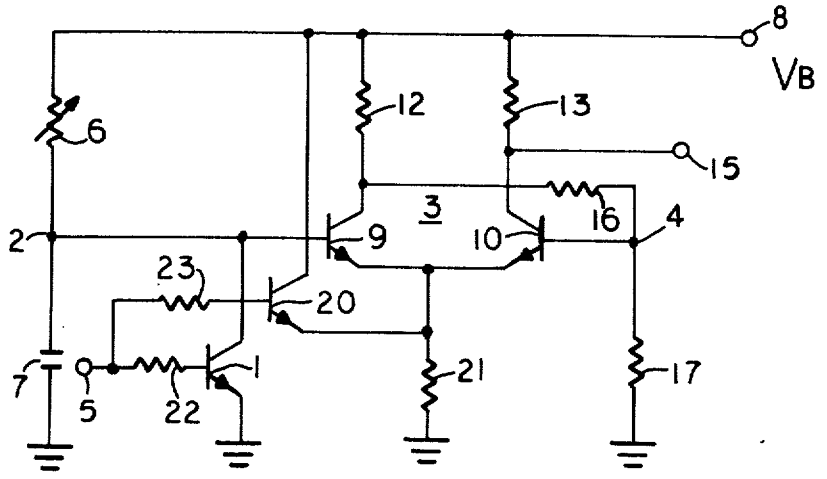

In FIG. 4 the emitter-collector circuit of the transistor 20 is interposed between the power supply terminal 8 and the emitter electrodes of the transistors 9 and 10, and resistor 21 is connected between the emitters of the differentially connected transistors 9 and 10 and ground. This resistor takes the place of the transistor 11 in FIGS. 1 and 3 and therefore has a relatively high impedance. Two resistors 22 and 23 are connected between the pulse input terminal 5 and the bases of hte transistors 1 and 20, respectively. The resistor 16 is connected to the collector electrode of the transistor 9 instead of to the power supply terminal 8 and makes the differential amplifier 3 similar in to a Schmidt trigger circuit to improve the sharpness of the output pulse signal.

In the operation of the circuit in FIG. 4, as the input positive pulse in FIG. 2A rises, the potential of the emitter electrodes of the transistors 9 and 10 also rises, so that the both transistors 9 and 10 are non-conductive for the duration of the positive pulse applied to the input terminal 5.

When the voltage at the terminal 2 reaches the level $V_F$ as shown in FIG. 2B, where $V_F$ is still the voltage at the terminal 4, but is determined by a voltage divider that includes the resistor 12 in addition to the resistors 16 and 17, the transistor 9 becomes conductive. The voltage $V_F$ is given by the equation:

$$V_F = V_B\ R_{17}/R_{12}+R_{16}+R_{17}$$

As the voltage at its collector drops, as shown in FIG. 2D, this drop is applied to the base of the transistor 10 to make that transistor non-conductive more suddenly than by differential action, alone.

Figure 5:
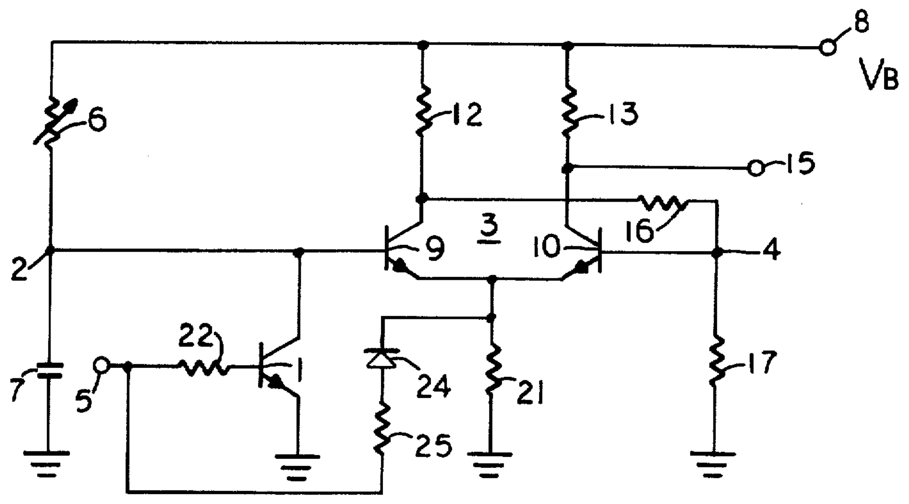

In FIG. 5 a diode 24 and resistor 25 are connected between the pulse input terminal 5 and the emitters of the transistors 9 and 10. This diode takes the place of the transistor 20 in FIG. 4 and raises the voltage across the common emitter resistor 21 to a high enough level to keep both of the transistors 9 and 10 non-conductive for the duration of each of the pulses shown in FIG. 2A. Otherwise, the circuit in FIG. 5 is identical to that in FIG. 4 and operates in the same way.

Figure 6:
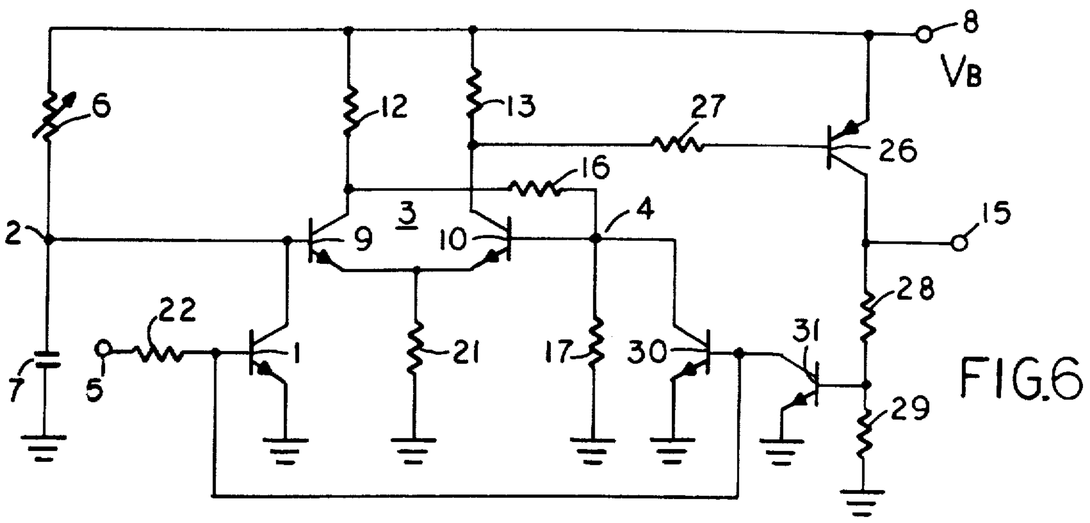
FIG. 6 is a schematic circuit diagram of another embodiment of the present invention.

In the embodiment shown in FIG. 6, the collector electrode of the transistor 10 is connected to a base electrode of an output transistor 26 by way of a resistor 27. This transistor is a PNP transistor, the opposite type from the other transistors, which are all NPN transistors. The emitter electrode of the transistor 26 is connected to the power supply terminal 8 and collector electrode is connected to ground through two resistors 28 and 29. The output terminal 15 is connected to the collector electrode of the transistor 26. A transistor 30 has its emitter-collector output circuit connected between the base electrode of the transistor 10 and ground. The pulse input terminal 5 is connected by the resistor 22 to the bases of the transistors 1 and 30. The emitter-collector circuit of a transistor 31 is connected directly across the base-emitter input circuits of the transistors 1 and 30, and the base of the transistor 31 is connected to the common connection between the resistors 28 and 29.

Figure 7A:
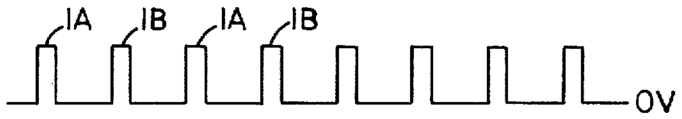
FIGS. 7A–7C are time charts of the waveforms encountered in operation of the circuit in FIG. 6.

The operation of this circuit is explained in accordance with the time chart of waveforms shown in FIG. 7.

This circuit can produce a delay longer than the time between successive incoming pulses and can be arranged to respond to alternate pulses or every third pulse or even less frequent ones. The input signal is applied to the input terminal 5 shown in FIG. 7A and is connected to not only the input transistor 1 but also to the transistor 30 through the resistor 22. Both transistors 1 and 30 are kept conductive for the duration of the positive pulse 1A (FIG. 7A) at the input terminal 5, so that the capaacitor 7 discharges and both transistors 9 and 10 of the differential amplifier 3 are non-conductive as in previous embodiments. The transistor 26 is also non-conductive, so that zero voltage appears at the output terminal 15.

Figure 7B:
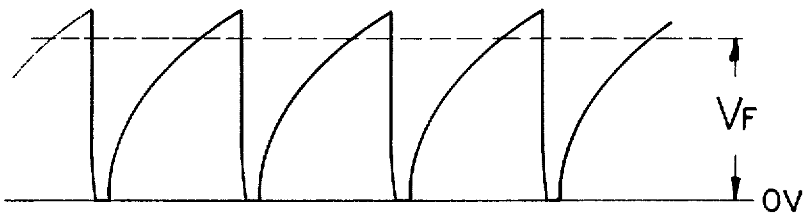
Figure 7C:
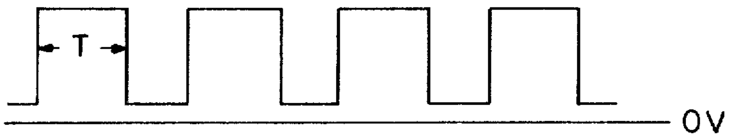

FIG. 7B shows the potential appearing at the base electrode of the transistor 9. The capacitor 7 begins to charge through the variable resistor 6 after the positive input pulse 1A ends. At the same time the transistor 10 becomes conductive, so that the potential at the output terminal 15 rises almost up to power supply voltage $V_B$, as shown in FIG. 7C, because the transistor 26 is changed to conductive state by the drop in voltage across the resistor 13. Although the input pulse 1B appears at the input terminal 5 during this time, it does not affect the transistors 1 and 30 because the transistor 31 is conductive and the low impedance of its emitter-collector circuit clamps the bases of the transistors 1 and 30 at approximately ground potential and thus keeps them non-conductive. When, the potential at the base electrode of the transistor 9 exceeds the reference bias voltage $V_F$, the transistor 9 turns to be conductive, whereby the transistor 10 becomes non-conductive after the pulse 1B. This causes the output voltage at the terminal 15 to drop to zero volts as the transistor 26 is made non-conductive.

The delay time T can be made either shorter or longer than the repetition time of the input pulses. This embodiment of FIG. 6 has an additional important advantage, which is that noise signals applied to the input signal terminal 5 will be by-passed through the transistor 30 as long as the transistor 30 is kept conductive.

Figure 8A:
FIGS. 8A–8C are time charts for explanation of the possible disadvantages of certain embodiments of the invention.
Figure 8B:
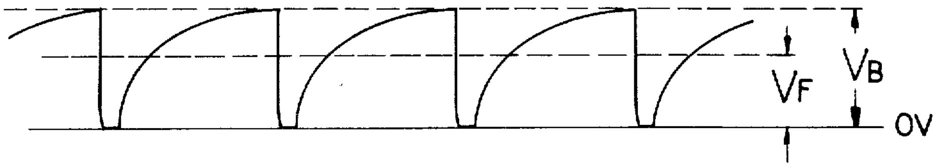
Figure 8C:
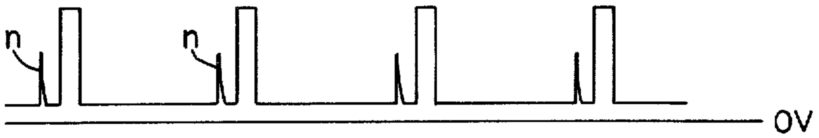

In the embodiments described so far, a certain disadvantage may arise. If the capacitor 7 of the time constant circuit is charged up to the full power supply voltage $V_B$, as shown in FIG. 8B, due to a low repetition rate of the input pulses, the transistor 9 would be forced to be fully condictive, that is, it would reach a fully saturated state. Then, when the next input pulse arrived to make the transistor 9 non-conductive, the minority carriers having existed in the base region of the transistor 9 will discharge or flow through the power supply terminal 8, the resistor 13, collector-emitter circuit of the transistor 10, the emitter-base circuit of the transistor 9, and the collector-emitter circuit of the transistor 1. Such minority carrier current would cause a noise pulse n at the output terminal 15, as shown in FIG. 8C. The problem is that the transistor 9 is under the fully saturated state when the succeeding input pulse appears at the input terminal.

There are two ways to avoid this problem. One is to suppress the base potential of the transistor 9 in order not to let the transistor go to the saturated state. Another is to discharge the capacitor 7 after the potential of the base electrode of the transistor 9 reaches the reference bias voltage $V_F$.

Figure 9:
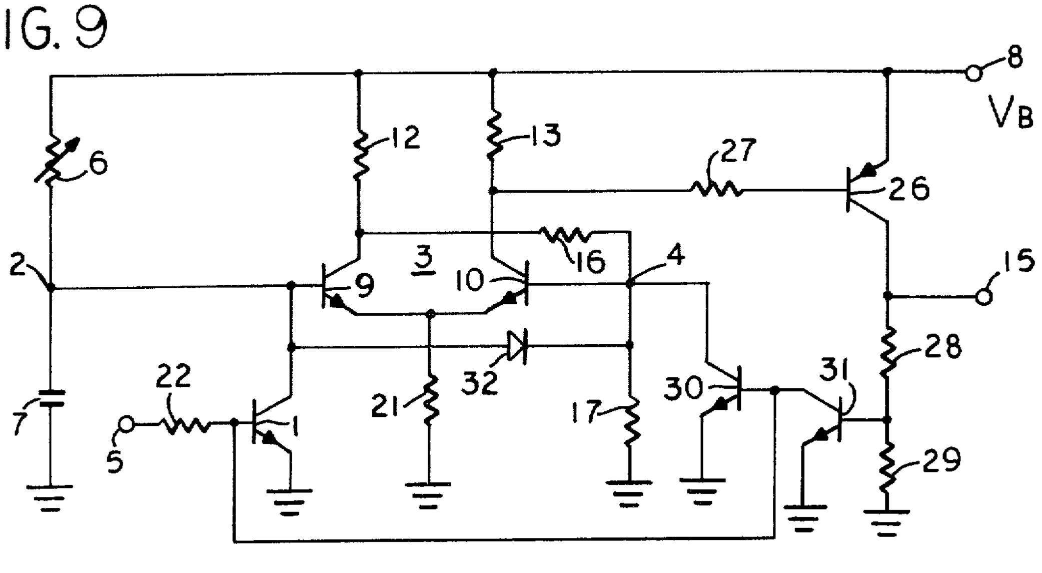
FIG. 9 is a schematic circuit diagram of an embodiment that avoids such possible disadvantages.

FIG. 9 shows an embodiment in which the transistor 9 is kept from reaching saturation. The difference between the embodiments of FIGS. 6 and 9 is that in FIG. 9 a diode 32 is connected in series between the base electrodes of the two transistors 9 and 10, and is polarized to be conductive when the base of the transistor 9 is positive with respect to the base of the transistor by more than the forward-bias voltage of the diode 32. Then the transistor 9 is prevented from becoming fully conductive, so that no noise signal *n* appears at the output terminals 15 due to saturation of the transistor 9. This diode connection is also applicable to the circuits in FIGS. 1, 3, 4, 5 and 6.

Figure 10:
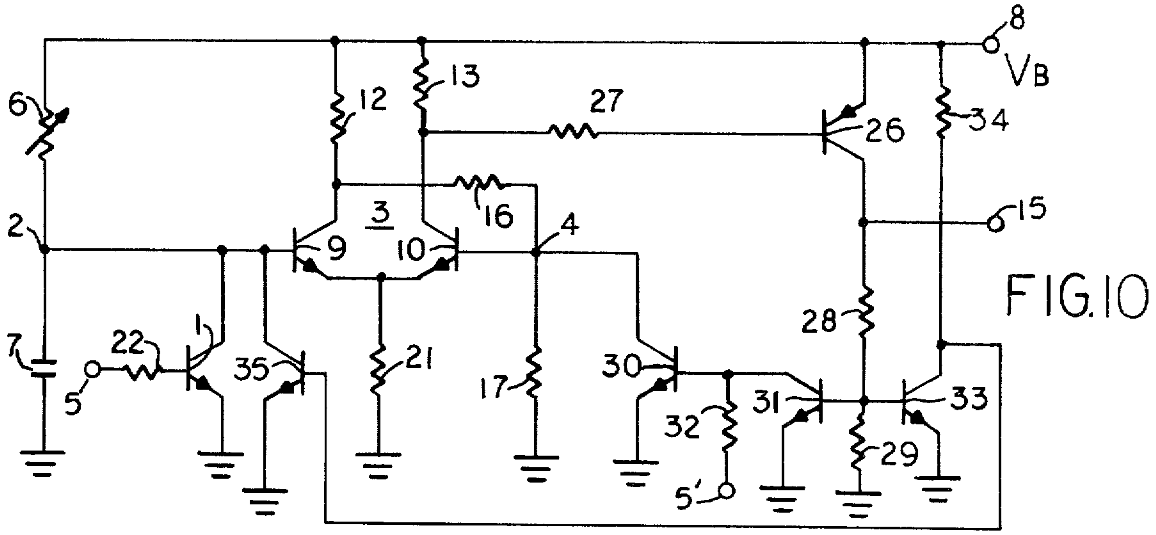
FIGS. 10 and 12 show further improved circuit configurations of the invention.
Figure 12:
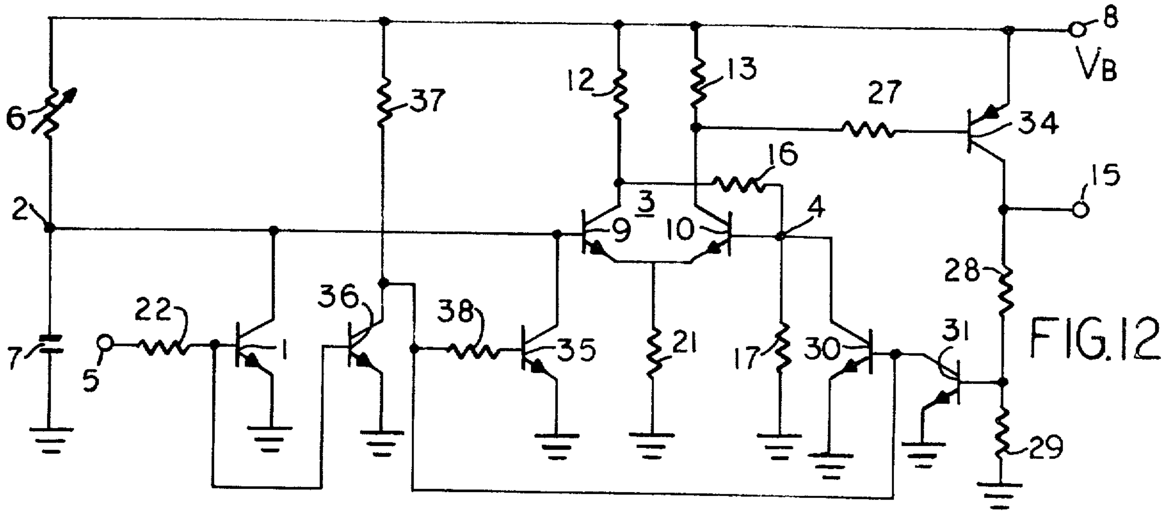

The other one of the two ways mentioned above is to discharge the capacitor in the time constant circuit 2 after delayed ouput signal is obtained at the output terminal 15. Circuits that operate in this manner are illustrated in FIG. 10 and FIG. 12. The delay circuit in FIG. 10 has two pulse signal input terminals 5 and 5′, the latter to receive pulses of opposite polarity from pulses applied to the terminal 5. The terminal 5′ is connected to the base electrode of the transistor 30 through a resistor 32, so that if one more transistor is added to the circuit to invert the input signal, the input terminal 5′ can be deleted. This embodiment also includes an output inverter circuit comprising a transistor 33 and a load resistor 34. The collector output electrode of the transistor 33 is connected to the base of a transistor 35. The emittercollector output circuit of the transistor 35 is connected in parallel with the capacitor 5 and the output circuit of the transistor 1.

Figures 11A, 11B, 11C, 11D:
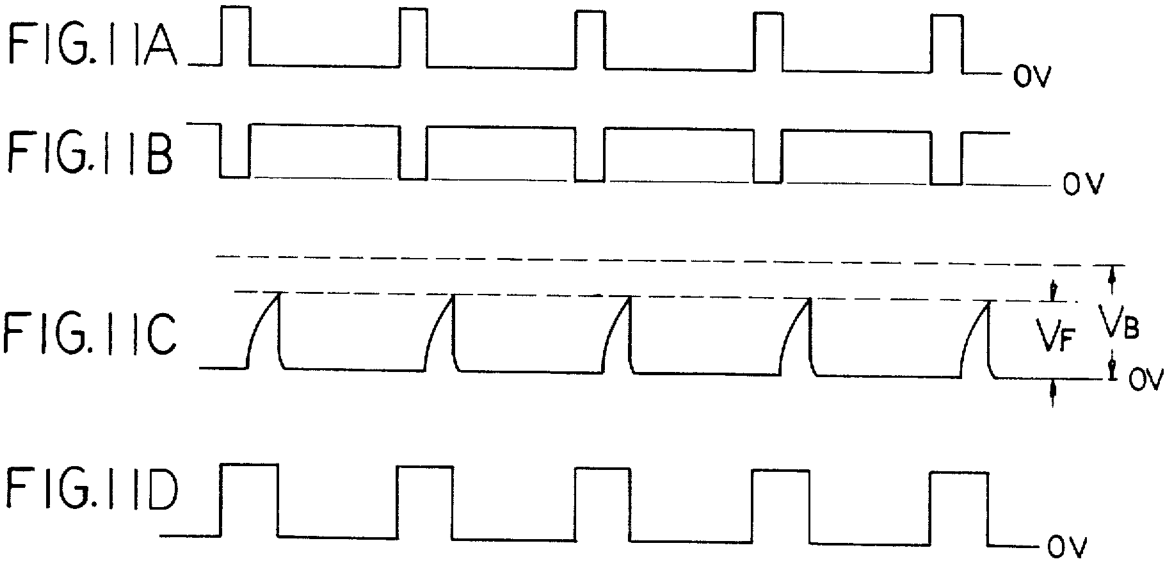
FIGS. 11A–11D are time charts of the waveforms encountered in operation of the circuit depicted in FIG. 10.

The operation of this circuit will be explained with reference to the waveforms depicted in FIGS. 11A–11D. FIG. 11A shows the pulse input signal applied to the input terminal 5, and FIG. 11B shows the inverted pulse input signal applied to the input terminal 5′. The pulse signal applied to the terminal 5 causes the transistor 1 to be conductive for the duration of each of the positive pulses in FIG. 11A. The inverted pulse signal applied to the terminal 5′ causes the transistor 30 to be conductive for the duration of each of the long positive pulses in FIG. 11B unless the transistor 31 is conductive, in which case, the base of the transistor 30 would be clamped approximately to ground potential until the transistor 31 becomes non-conductive.

Following each of the positive pulses in FIG. 11A, the voltage across the capacitor 7, begins to rise as shown in FIG. 11C. The transistor 9 is non-conductive, and the transistor 10 becomes conductive, causing a voltage drop across the load resistor 13. This voltage causes the PNP transistor 26 to be conductive, producing, at the output terminal 15, the positive portion of the signal in FIG. 11D. A fraction of this positive signal at the common circuit point between the resistors 28 and 29 biases both of the transistors 31 and 33 to be conductive. The conductive transistor 31 clamps the base of the transistor 30, as previously described, and keeps the initial part of the positive pulse in FIG. 11B from making the transistor 30 conductive.

After the voltage across the capacitor 7 reaches to the reference bias voltage $V_F$, the transistor 9 becomes conductive, causing the transistor 10 to become non-conductive. This raises the voltage at the base of the PNP transistor 26 to the $V_B$ level and makes that transistor non-conductive. When the transistor 26 becomes non-conductive, both of the transistors 31 and 33 become non-conductive because the output signal at the terminal 15 and the voltage at the bases of transistors 31 and 33 drop to zero volts. This causes the transistor 35 to become conductive, which discharges the capacitor 7. The transistor 10 does not become conductive until the next input pulse applied to the terminal 5 comes because the transistor 30 keeps the transistor 10 non-conductive for the remainder of the positive pulse signal depicted in FIG. 11B.

FIG. 12 shows another circuit configuration that operates in the same manner as the circuit in FIG. 10. FIG. 12 includes an inverter circuit comprising a transistor 36 and a load resistor 37. The base of the transistor 36 is connected to the base of the transistor 1, and the collector of the transistor 36 is connected to the base of the transistor 30, and, by means of a resistor 38, to the base of the transistor 35.

In operation, the inverted input signal of FIG. 11B is applied to both the base electrode of the transistor 35 connected across the capacitor 7 and to the base electrode of the transistor 30. After the voltage across the capacitor 7 reaches the reference bias voltage $V_F$ as shown in FIG. 11C, the transistor 31 becomes non-conductive in the same manner as in FIG. 10. The inverted input signal in FIG. 11B is produced by the transistor 36 and makes the transistor 35 conductive, thereby discharging the capacitor 7 quickly, as shown in FIG. 11C. Until the end of the pulse in FIG. 11D, the transistor 31 is conductive and prevents the transistor 35 from becoming conductive.

A further advantage of the embodiments in FIGS. 10 and 12, in addition to the anti-noise effect of the output signal is that these circuits respond well to narrow input pulses. It some times happens that the width of the positivegoing input pulse is very narrow so that the capacitor 7 in FIG. 1, for example, cannot discharge the whole charge stored therein in the short duration of the pulse. If this happens, it causes the delay time to be wrong. In the circuits in FIGS. 10 and 12, the capacitor 7 discharges as soon as the voltage thereacross reaches $V_F$. Thus, the capacitor is already discharged before the next pulse comes along.

What is claimed is:

1. A delay circuit comprising:

A. first and second power supply terminals;

B. a differential amplifier comprising:
  1. first and second differentially connected transistors having their emitters connected together,
  2. first and second input terminals connected, respectively, to the bases of said first and second transistors,
  3. an output terminal,
  4. means connecting said output terminal to the collector of one of said differentially connected transistors, and
  5. means connecting said connected together emitters and the collectors of said differentially connected transistors to said first and second power supply terminals, respectively;

C. a time constant circuit connected to said first input terminal;

D. a first clamping circuit connected to said first input terminal to control the conductivity of said first transistor;

E. a second clamping circuit connected to said differential amplifier to control the conductivity of said second transistor;

F. pulse input means to apply pulses to be delayed to said first and second clamping circuits for activating the latter; and G. a reference voltage circuit connected to said second input terminal, whereby said second transistor is normally conductive when said first transistor is nonconductive and said second clamping circuit is not activated.

2. The delay circuit of claim 1 wherein said time constant circuit comprises:

A. a capacitor and a resistor connected in series between said power supply terminals; and B. a common circuit point between said capacitor and resistor connected to said first input terminal.

3. The delay circuit of claim 1 wherein said time constant circuit comprises a capacitor and a resistor connected in parallel between one of said power supply terminals and said first input terminal, said clamping circuit being connected to the other of said power supply terminals.

4. The delay circuit of claim 1, further comprising a unidirectionally conductive semiconductor device connected in series between said input terminals.

5. The delay circuit of claim 1, further comprising

A. a constant current source connected in series between said emitters and said first power supply terminal and including an additional transistor; and B. means connecting said second clamping circuit to said additional transistor to make said transistor in said constant current source nonconductive for the duration of each of said pulses to be delayed.

6. A delay circiut comprising:

A. first and second power supply terminals;

B. a differential amplifier comprising:
  1. first and second differentially connected transistors having their emitters connected together,
  2. first and second input terminals connected, respectively, to the bases of said first and second transistors,
  3. an output terminal,
  4. means connecting said output terminal with the collector of one of said differentially connected transistors,
  5. a high resistance resistor connected in series between said emitters of said differentially connected transistors and said first power supply terminal, and
  6. means connecting the collectors of said differentially connected transistors to said second power supply terminal;

C. a time constant circuit connected to said first input terminal;

D. a first clamping circuit connected to said first input terminal to control the conductivity of said first transistor;

E. pulse input means to apply pulses to be delayed to said first clamping circuit;

F. unidirectionally conductive means constituting a second clamping circuit connected to said pulse input means to be made conductive for the duration of each of said pulses and connected to the emitters of said differentially connected transistors to bias said emitters to cause both of said differentially connected transistors to be nonconductive for the duration of each of said pulses; and G. a reference voltage circuit connected to said second input terminal, whereby said second transistor is normally conductive when said first transistor is nonconductive and said second clamping circuit is not conductive.

7. The delay circuit of claim 6 in which said unidirectionally conductive means comprises a further transistor comprising an emitter-collector circuit connected in series between said emitters and said second power supply terminal, and a base connected to said pulse input means.

8. The delay circuit of claim 6 in which said unidirectionally conductive means comprises a diode connected in series between said pulse input means and said emitters.

9. A delay circuit comprising:

A. first and second power supply terminals;

B. a differential amplifier comprising:

1. first and second differentially connected transistors having their emitters connected together,
2. first and second input terminals connected, respectively, to the bases of said first and second transistors,
3. an output terminal,
4. means connecting said output terminal to the collector of one of said differentially connected transistors, and
5. means connecting the collectors and emitters of said differentially connected transistors to said first and second power supply terminals, respectively;

C. a time constant circuit connected to said first input terminal;

D. a first clamping circuit connected to said first input terminal to control the conductivity of said first transistor;

E. a second clamping circuit connected to said second input terminal of the differential amplifier to control the conductivity of said second transistor;

F. pulse input means to apply pulses to be delayed to said first and second clamping circuits;

G. a reference voltage circuit connected to said second input teminal, whereby said second transistor is normally conductive when said first transistor is nonconductive and said second clamping circuit is not conductive; and H. a positive feedback connection from the collector of said first differentially connected transistor to the base of said second differentially connected transistor, with both of said clamping circuits being conductive for the duration of each of said pulses to clamp both of said input terminals to a nonconductive level.

10. A delay circuit comprising:

A. first and second power supply terminals;

B. a differential amplifier comprising:

1. first and second differentially connected transistors having their emitters connected together,
2. first and second input terminals connected, respectively, to the bases of said first and second transistors,
3. an output terminal,
4. means connecting said output terminal with the collector of one of said differentially connected transistors, and
5. means connecting the emitters and collectors of said differentially connected transistors to said first and second power supply terminals, respectively;

C. a time constant circuit connected to said first input terminal;

D. a first clamping circuit connected to said first input terminal to control the conductivity of said first transistor;

E. a second clamping circuit connected to said differential amplifier to control the conductivity of said second transistor;

F. pulse input means to apply pulses to be delayed to said first clamping circuit;

G. a reference voltage circuit connected to said second input terminal, whereby said second transistor is normally conductive when said first transistor is nonconductive and said second clamping circuit is nonconductive; and H. amplifying means connecting the collector of said second differentially connected transistor to said second clamping circuit to keep said second clamping circuit nonconductive as long as said second differentially connected transistor is conductive.

11. The delay circuit of claim 10 comprising, in addition, means to apply inverted replicas of said pulses to said second clamping circuit to cause said second clamping circuit to be conductive when said first-named clamping circuit is non-conductive.

* * * * *